(12) United States Patent
Unterberger

(10) Patent No.: US 6,917,261 B2
(45) Date of Patent: Jul. 12, 2005

(54) COMPONENT OPERATING WITH BULK ACOUSTIC WAVES, AND HAVING ASYMMETRIC/SYMMETRICAL CIRCUITRY

(75) Inventor: Michael Unterberger, Unterhaching (DE)

(73) Assignee: EPCOS AG, Munich (DE)

( * ) Notice: Subject to any disclaimer, the term of this patent is extended or adjusted under 35 U.S.C. 154(b) by 44 days.

(21) Appl. No.: 10/728,462

(22) Filed: Dec. 5, 2003

(65) Prior Publication Data

US 2004/0150293 A1 Aug. 5, 2004

(30) Foreign Application Priority Data

Dec. 5, 2002 (DE) .......................................... 102 56 937

(51) Int. Cl.[7] .......................... H03H 9/205; H03H 9/54; H03H 11/32
(52) U.S. Cl. ......................... 333/189; 333/25; 310/322; 310/334; 310/335
(58) Field of Search ................................ 333/186–192, 333/25; 310/322, 323, 334, 335

(56) References Cited

U.S. PATENT DOCUMENTS

| | | | | |
|---|---|---|---|---|
| 3,568,108 A | * | 3/1971 | Poirier et al. ............... | 333/187 |
| 5,864,261 A | * | 1/1999 | Weber ......................... | 333/187 |
| 6,107,721 A | * | 8/2000 | Lakin ........................... | 310/321 |
| 6,670,866 B2 | * | 12/2003 | Ella et al. ..................... | 333/133 |
| 6,720,844 B1 | * | 4/2004 | Lakin ........................... | 333/189 |

* cited by examiner

Primary Examiner—Barbara Summons
(74) Attorney, Agent, or Firm—Schiff Hardin LLP

(57) ABSTRACT

A component operating with bulk acoustic waves has two Bulk Acoustic Wave (BAW) resonators that are stacked and are acoustically coupled to one another, with a first resonator being connected to an asymmetric port, and a second resonator being connected to a symmetrical port. The acoustic coupling is provided by a partially permeable coupling layer system, which has an alternating sequence of at least two λ/4 mirror layers with different acoustic impedance. The coupling layer system furthermore has a compensation layer, which has an approximate thickness of λ/8. The compensation layer according to the invention makes it possible to match any discrepancy in the phase difference (which is caused by reflections on the mirror layers) from the predetermined 180° between the connections of the symmetrical port to approximately 180°.

12 Claims, 10 Drawing Sheets

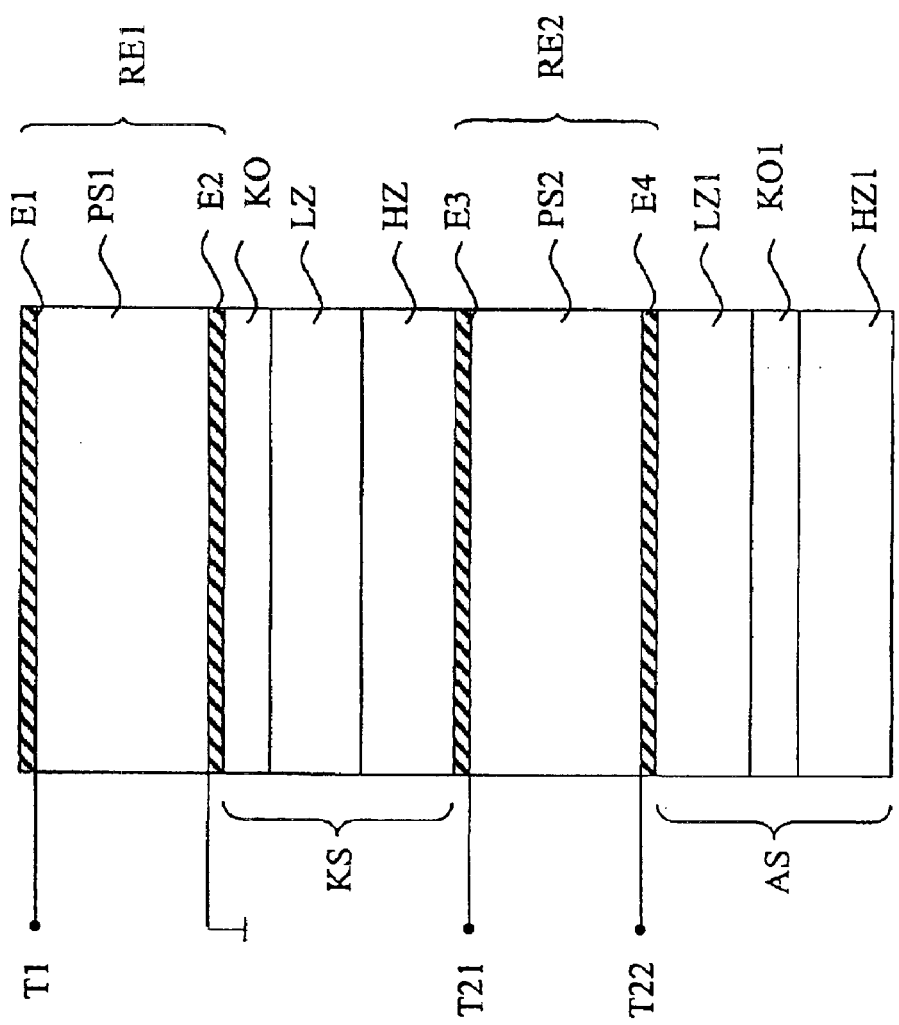

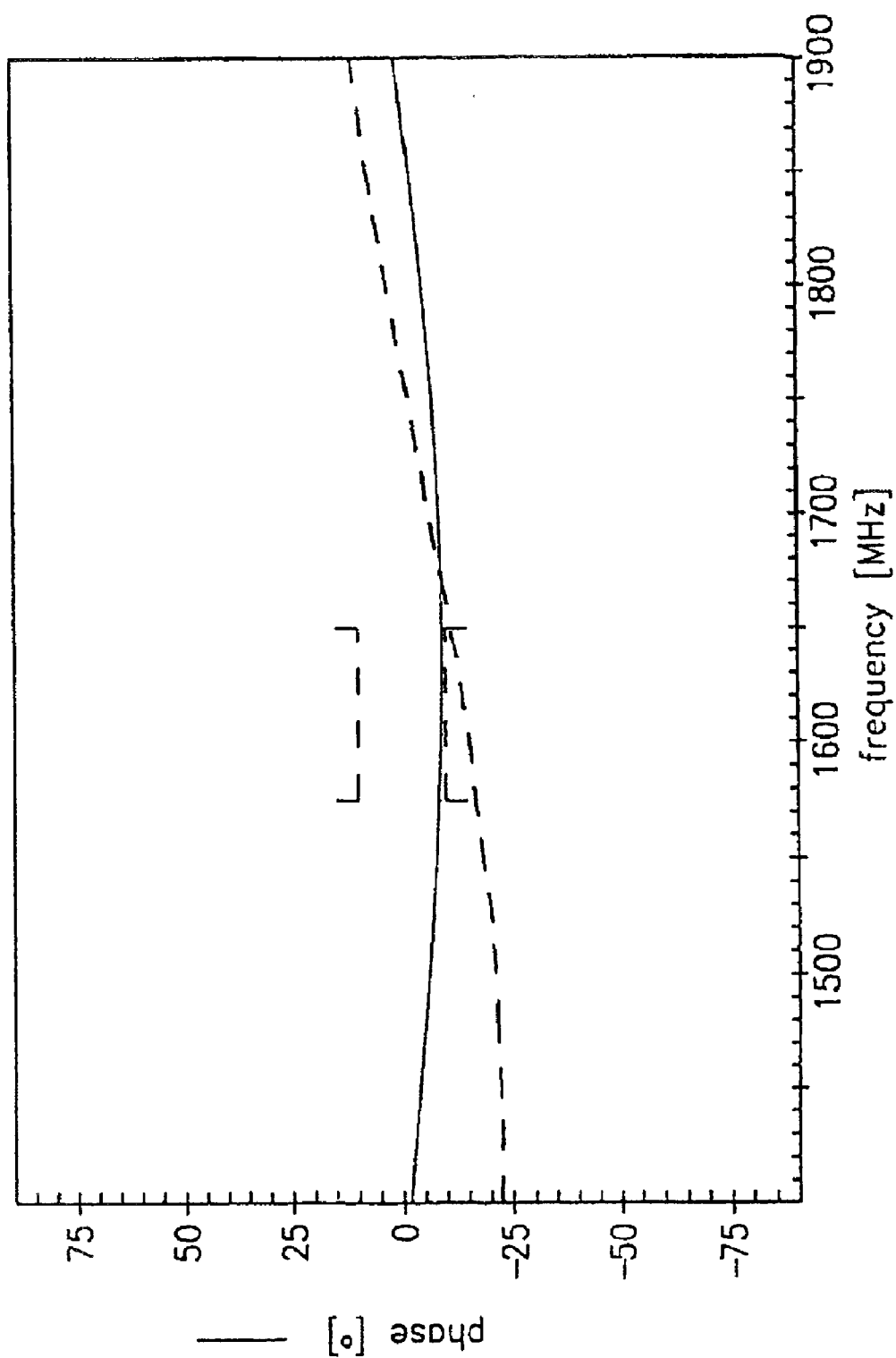

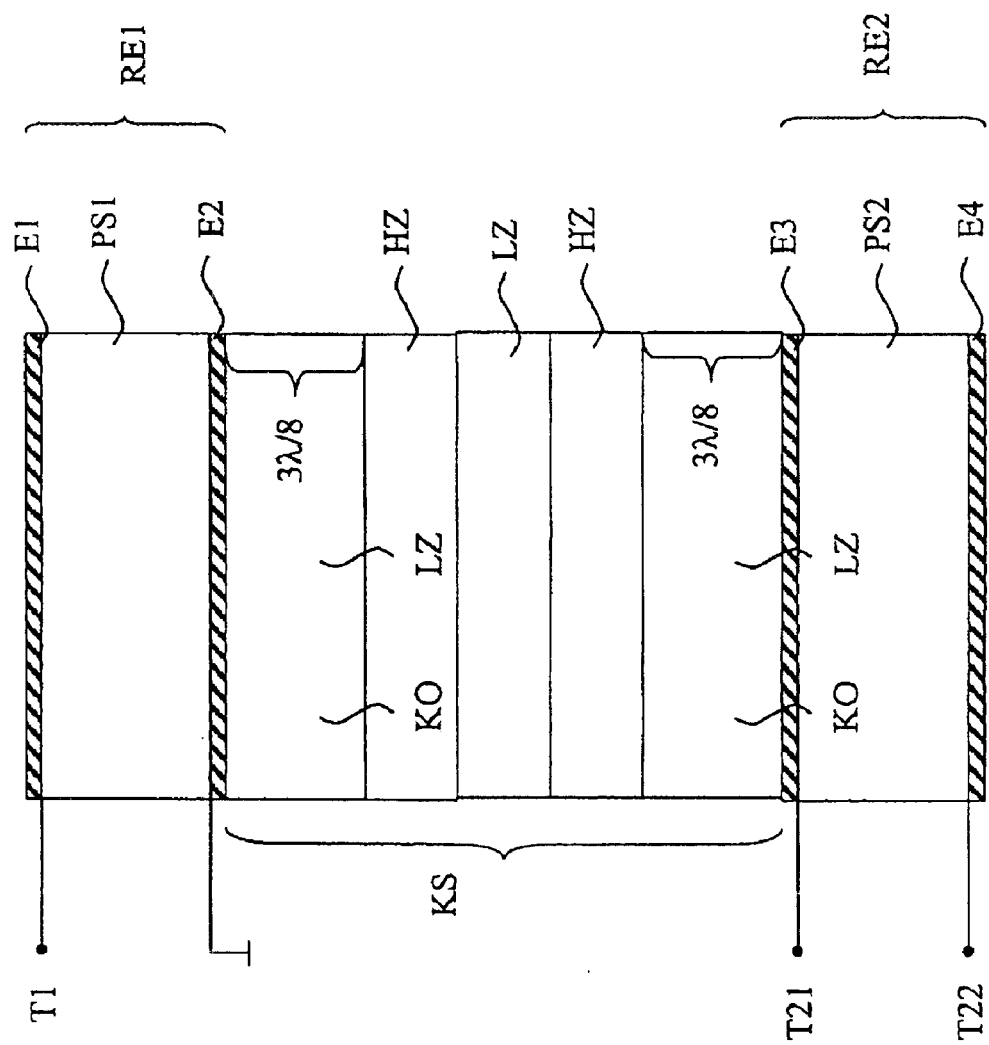

COMPONENT OPERATING WITH BULK ACOUSTIC WAVES, AND HAVING ASYMMETRIC/SYMMETRICAL CIRCUITRY

BACKGROUND OF THE INVENTION

The invention relates to a component operating with bulk acoustic waves, and particularly to a stacked crystal filter with thin-film resonators that are stacked one on top of the other and are connected to one another (or Thin Film Bulk Acoustic Wave Resonator, "FBAR"), which is also referred to as a Bulk Acoustic Wave resonator (or BAW resonator).

Resonators such as these are particularly suitable for bandpass radio-frequency filters in modern filter technology and may, for example, be used in mobile communication appliances.

A resonator operating with bulk acoustic waves has at least one piezoelectric layer that is arranged between two metal layers (electrodes). In a stacked crystal filter, two or more resonators are stacked one on top of the other, for example by a second piezoelectric layer being deposited first of all on the uppermost electrode of the lower resonator, after which an upper electrode is deposited for the upper resonator. In this case, the upper and the lower resonator have a common electrode, and are acoustically coupled to one another.

It is known that a BAW resonator can be provided with an acoustic mirror, which is preferably arranged between a mechanical mount substrate and the BAW resonator. The acoustic mirror comprises alternating layers which respectively have a low and a high acoustic impedance, with their layer thicknesses in each case being approximately one quarter of the wavelength of the acoustic primary mode (related to the speed of propagation of the acoustic wave in the respective material). The acoustic mirror thus represents one or more boundary surfaces, which, at the resonant frequency, reflect the acoustic wave back into the resonator, and prevent the wave from emerging in the direction of the mount substrate.

A partially permeable acoustic mirror may be arranged between the upper and the lower resonator of the stacked crystal filter. The partially permeable acoustic mirror forms a coupling layer system, and can be used to control the acoustic coupling between the two resonators.

When radio-frequency filters are being produced for mobile communication applications, it is often desirable in order to reduce the space requirement for the filter at the same time to act as the Balun, with an asymmetric signal being processed to perform antiphase signals at a symmetrical output.

FIG. 1 shows, schematically, a known stacked crystal filter with an integrated Balun functionality. A first resonator RE1 is formed by a first piezoelectric layer PS1, a first electrode E1 and a second electrode E2, and is connected between a signal-carrying connection T1 of a first, asymmetric electric port and ground.

A second resonator RE2 is formed by a second piezoelectric layer PS2, a third electrode E3 and a fourth electrode E4, and is connected between a first connection T21 and a second connection T22 of a second, symmetrical electrical port.

The resonators RE1 and RE2 are acoustically connected to one another by way of a coupling layer system KS. The coupling layer system KS has alternately arranged mirror layers (which are partially permeable in the acoustic sense) with a high and a low acoustic impedance, respectively, (reference symbols HZ and LZ, respectively), which preferably have a thickness of $\lambda/4$, where $\lambda$ is the wavelength of the acoustic wave to be reflected.

This stacked crystal filter has the disadvantage that the components of the acoustic wave which are reflected on different boundary surfaces of the mirror layers of the coupling layer system have a phase difference between them and thus, in particular, contribute to the discrepancy in the phase difference of the symmetrical signals at the second port of about 15 to 20° from the desired phase difference value of 180°. Furthermore, this leads to varying amplitudes of the signals at the symmetrical port, which has been found to be disadvantageous for the functionality of the stages of an electronic circuit (for example, of an amplifier) to be connected downstream.

SUMMARY OF THE INVENTION

The object of the present invention is to provide a component operating with bulk acoustic waves and having an asymmetric and a symmetrical port, with the phase difference between the symmetrical signals being approximately 180°.

According to the invention, this object is achieved by embodiments of a component as described below.

The invention provides a component operating with bulk acoustic waves that has a first resonator and a second resonator which are stacked one on top of the other and are acoustically coupled to one another by way of at least one coupling layer system whose acoustic characteristics make it at least partially permeable.

The coupling layer system has an alternating sequence of at least two $\lambda/4$ mirror layers with a different (high or low) acoustic impedance, as well as a compensation layer which has a thickness of approximately $\lambda/8$.

The first resonator has a first and a second electrode and a first piezoelectric layer, which is arranged between the first and the second electrode. The second resonator is formed by a third and a fourth electrode and a second piezoelectric layer that is arranged between the third and the fourth electrode. The component according to the invention has an asymmetric first port and a symmetrical second port. The first port, which is preferably arranged at the input, has a signal-carrying connection, with the first resonator being connected to the signal-carrying connection of the first port, and on the other hand being connected to a reference ground potential. The second port, which is preferably arranged at the output, has a first and a second connection. In this case, the second resonator is connected between the first and the second connection of the second port.

In one advantageous embodiment of the invention, further resonators can be provided that are stacked one on top of the other and are arranged above or below the first and the second resonator. It is possible for at least some of the further resonators to be in each case acoustically coupled to one another by way of further at least partially permeable coupling layer system.

In one advantageous refinement, the component according to the invention has an acoustic mirror on that side of the first and/or of the second resonator that faces away from the coupling layer system, and this acoustic mirror comprises at least two alternating layers with thicknesses of approximately $\lambda/4$, and with different acoustic impedances.

Silicon-oxide layers or else organic layers, in particular layers with a low dielectric constant and, in particular "low-k" dielectrics can be used as the layers with a low acoustic impedance. Layers composed of tungsten, molybdenum, aluminum nitride or sequences of them, may, for example, be used as the layers with a high acoustic impedance.

The compensation layer may be arranged between the mirror layers of the coupling layer system. A further possibility is to arrange the compensation layer between the second electrode and the uppermost mirror layer of the coupling layer system, or between the third electrode and the lowermost mirror layer of the coupling layer system.

It is possible for one of the mirror layers of the coupling layer system, preferably that with a low acoustic impedance, to be combined with the compensation layer in one layer. In this case, the layer thickness of a layer such as this is preferably $3\lambda/8$.

In one advantageous embodiment of the invention, at least one further compensation layer having an approximate thickness of $\lambda/8$ is provided and, for example, this can be integrated in the coupling layer system or in the acoustic mirror. It is also possible for the further compensation layer to be combined with one of the mirror layers of the coupling layer system, or with one of the layers of the acoustic mirror. In this case, the layer thickness of a layer such as this is preferably $3\lambda/8$.

The compensation layer and/or the further compensation layer may, for example, be composed of silicon oxide.

The component according to the invention is advantageous because it is possible to achieve a reduced discrepancy in the phase difference of 180° between the signals at the symmetrical port, and to keep the amplitude of these signals approximately the same.

DESCRIPTION OF THE DRAWINGS

The invention is explained in more detail in the following text with reference to figures which are schematic and are therefore not to scale.

FIG. 2a is a side view of a component according to the invention, illustrated schematically;

FIG. 2c is a graph showing the discrepancy in the phase difference of the symmetrical signals from 180° at the second port of a known component (dashed line) and of a component according to the invention (solid line);

FIG. 5 is a further embodiment of a component according to the invention having a different layer structure;

DETAILED DESCRIPTION OF THE PREFERRED EMBODIMENTS

FIG. 2a shows an embodiment of a component according to the invention, illustrated schematically. A first resonator RE1 is formed by a first piezoelectric layer PS1, a first electrode E1 and a second electrode E2, and is connected between a signal-carrying connection T1 of a first asymmetric electrical port, and ground. A second resonator RE2 is formed by a second piezoelectric layer PS2, a third electrode E3 and a fourth electrode E4, and is connected between a first connection T21 and a second connection T22 of a second, symmetrical electrical port. The resonators RE1 and RE2 are acoustically connected to one another by way of a coupling layer system KS. The coupling layer system KS has alternately arranged, partially permeable mirror layers with a high and a low acoustic impedance (reference symbols HZ and LZ, respectively), which preferably have a thickness of approximately $\lambda/4$. The coupling layer system KS furthermore has a compensation layer KO which, in this exemplary embodiment, is arranged between the second electrode E2 and the mirror layer LZ with a low acoustic impedance.

The piezoelectric layers of the resonators and of the electrodes are formed, for example, from aluminum nitride or aluminum.

An acoustic mirror AS is arranged underneath the second resonator RE2, and has a layer LZ1 with a low acoustic impedance, a layer HZ1 with a high acoustic impedance, and a further compensation layer KO1 arranged between them.

Figure 1:
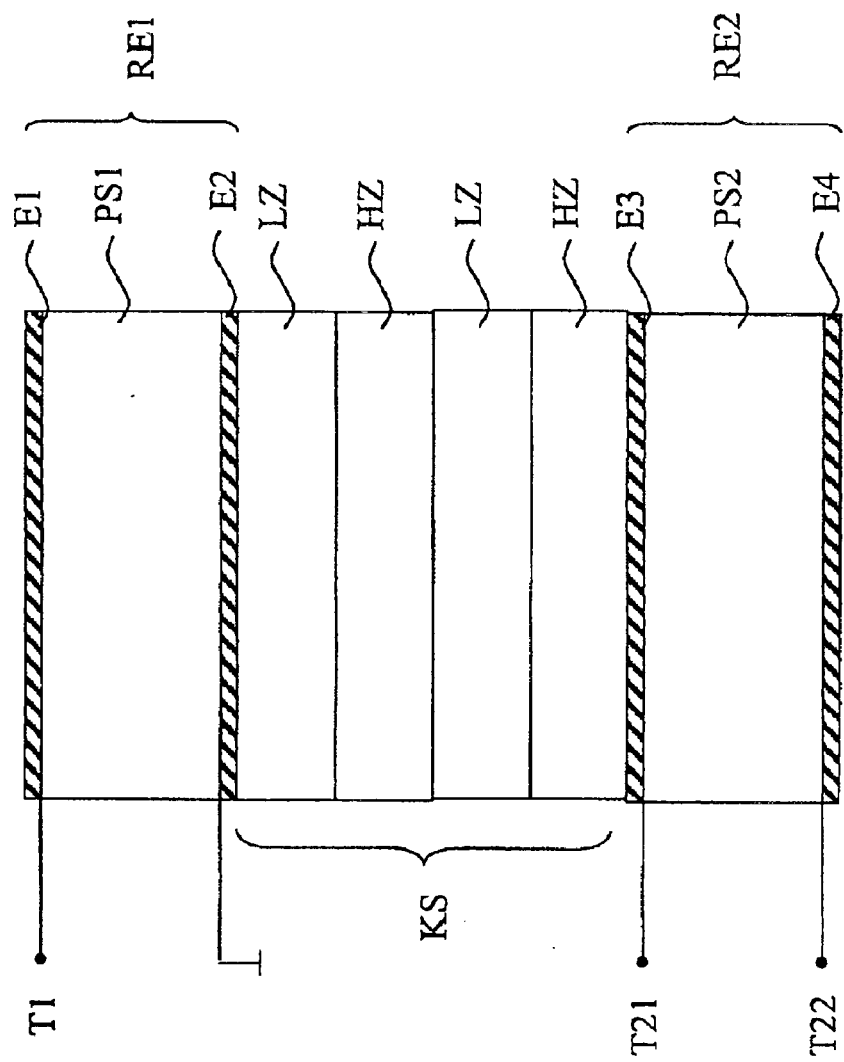
FIG. 1 is a side view of a known stacked crystal filter having an asymmetric input and a symmetrical output.
Figure 2B:
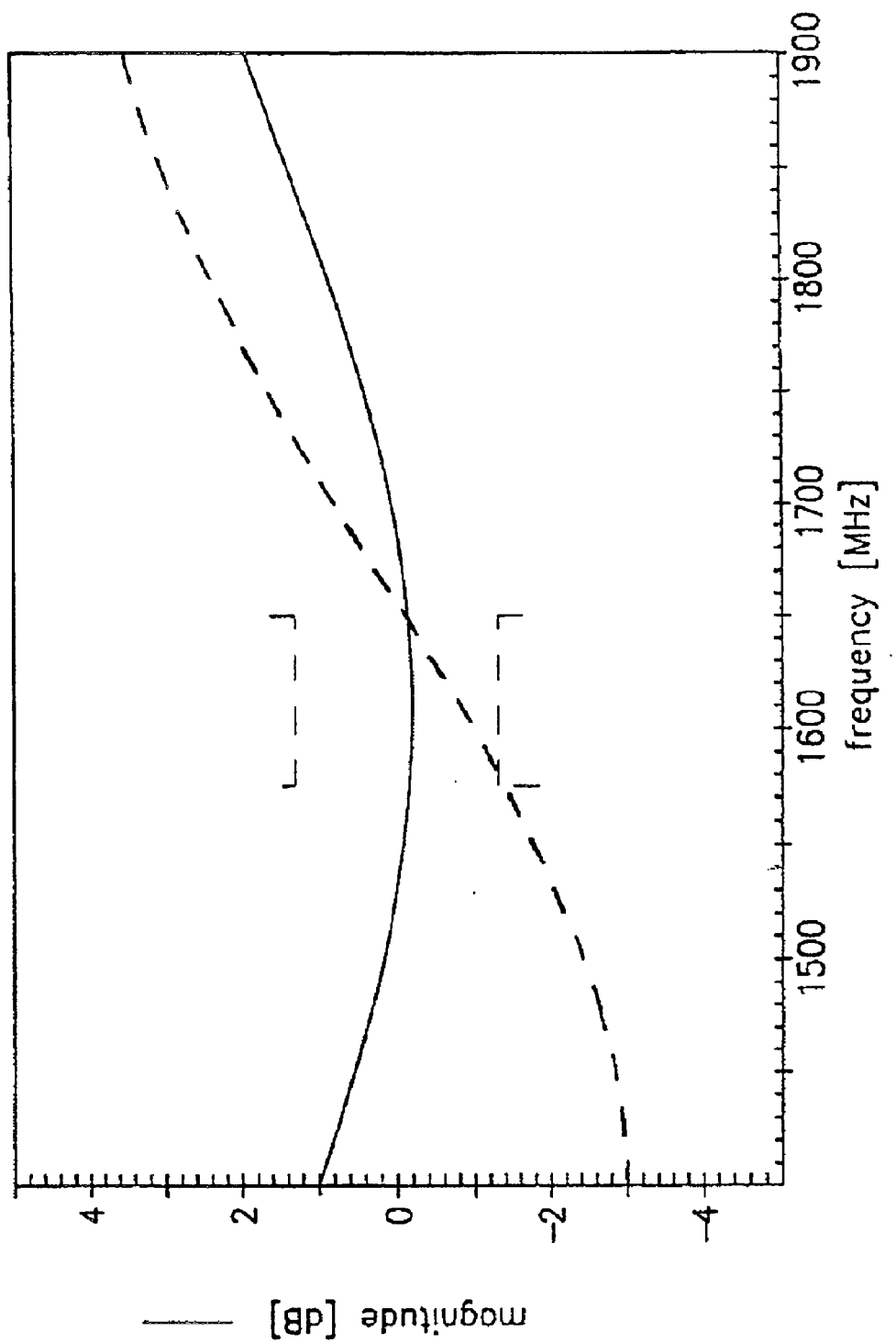
FIG. 2b is a graph showing the ratio of the amplitudes of the symmetrical signals at the second port of a known component (dashed line) and of a component according to the invention (solid line)

The results of a simulation of the amplitude and phase ratios in a stacked crystal filter according to the invention (which corresponds to the solid line) and a known stacked crystal filter (which corresponds to the dashed line) are shown in FIGS. 2b and 2c.

FIG. 2b compares the ratio of the amplitudes of the symmetrical signals at the second port of a known component and of a component according to an embodiment of the invention. FIG. 2c shows the discrepancy in the phase difference of the symmetrical signals from 180° at the second port of a known component, compared with that of a component according to an embodiment of the invention. In the predetermined passband between 1575 MHz and 1650 MHz, the known stacked crystal filter has a change in the amplitude ratio of the symmetrical signals of approximately 1.5 dB, and a discrepancy in the phase difference from 180° of about 15 to 20°. In the component according to the invention, the amplitude ratio of the symmetrical signals remains constant at approximately 1:1, that is to say the symmetrical signals have the same amplitude. The discrepancy in the phase difference from 180° is less than 10° in the component according to the invention.

Figure 3:
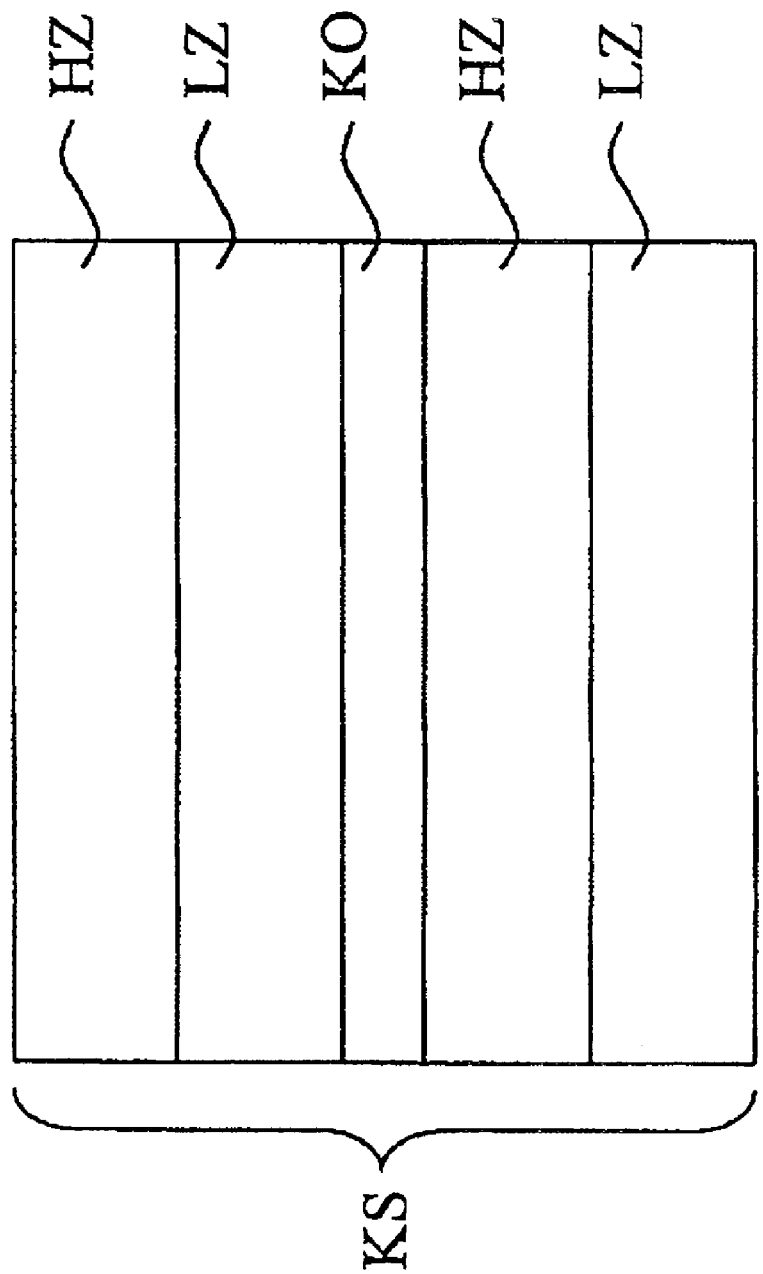
FIG. 3 is a side view of an alternate embodiment of the coupling layer system according to the invention.

One possible refinement of the coupling layer system KS is shown in FIG. 3. The compensation layer KO is in this case arranged between a first and a second layer stack which are each formed by a mirror layer pair LZ/HZ. The compensation layer may also be arranged above or below a layer stack with an alternating layer sequence.

Figure 4:
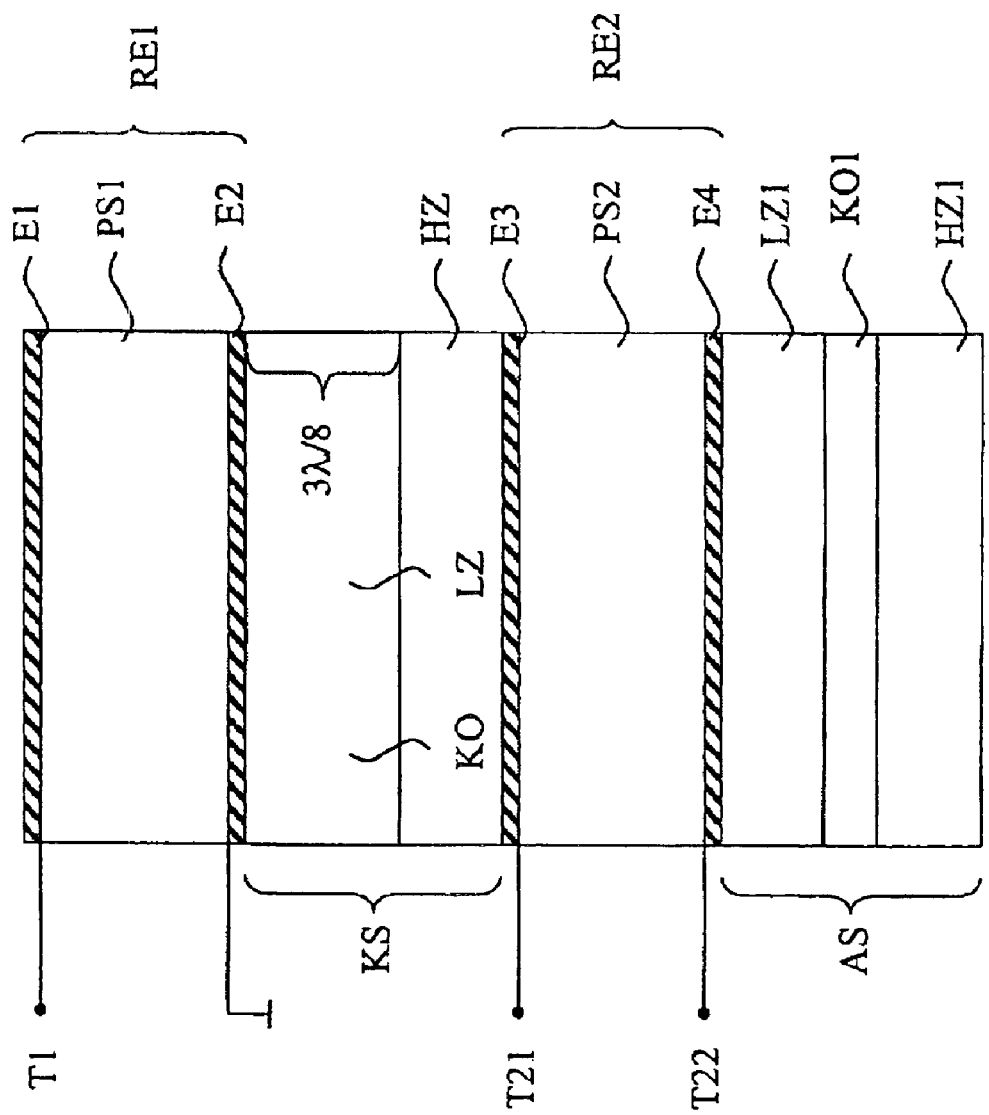
FIG. 4 is a further embodiment of a component according to the invention having a different layer structure.
Figure 7:
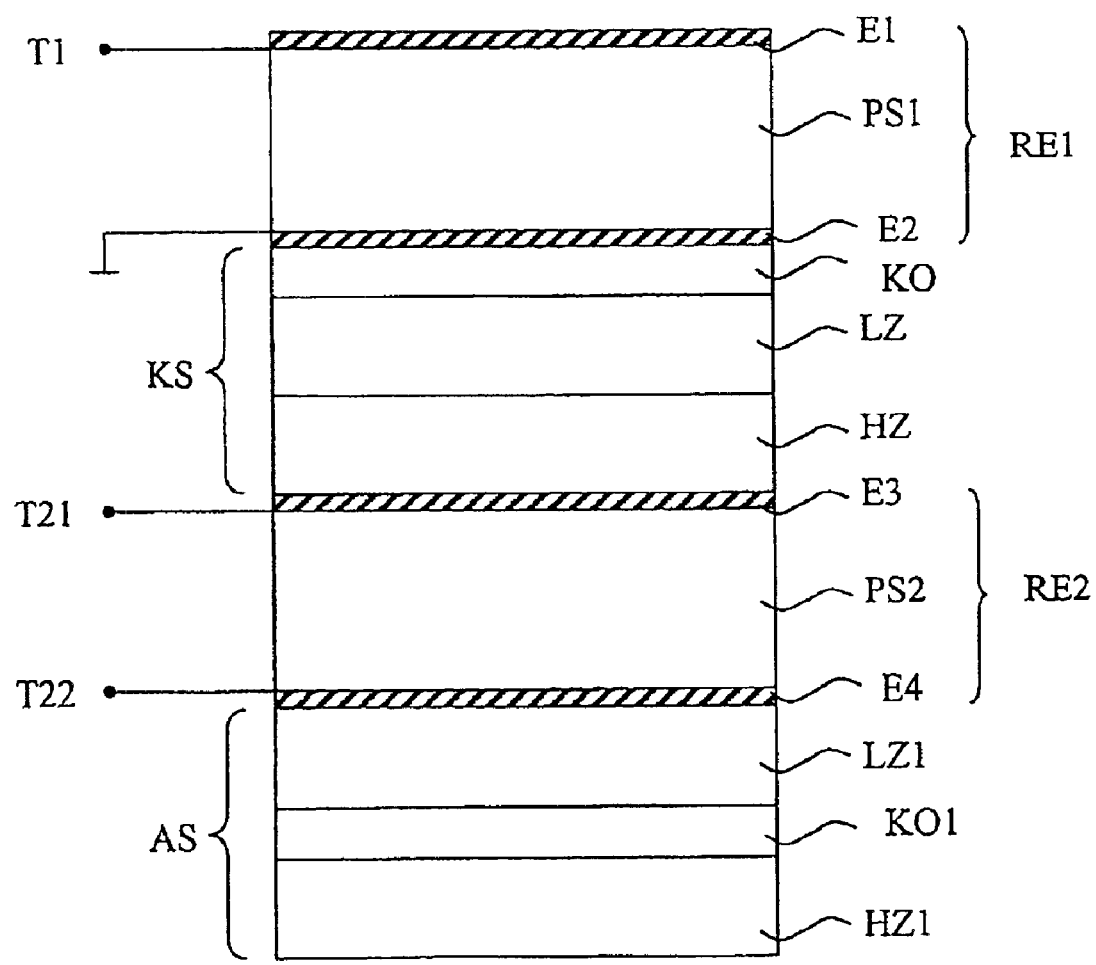
FIG. 7 is a further embodiment of a component according to the invention and presents a generalized version of the structure shown in FIG. 4.

FIG. 4 illustrates a further advantageous variant of the invention. In this case, the mirror layer LZ with a low acoustic impedance and the compensation layer KO are in the form of one layer with an approximate thickness of $3\lambda/8$. It is also possible for the compensation layer KO to be combined with the mirror layer HZ with a high acoustic impedance in one layer. A generalized variant can be seen in FIG. 7.

FIG. 5 shows a further exemplary embodiment of the invention. The coupling layer system KS has two compensation layers which, in this variant, are each combined with one of the mirror layers LZ with a low acoustic impedance, and form a layer whose thickness is approximately $3\lambda/8$.

Figure 6A:
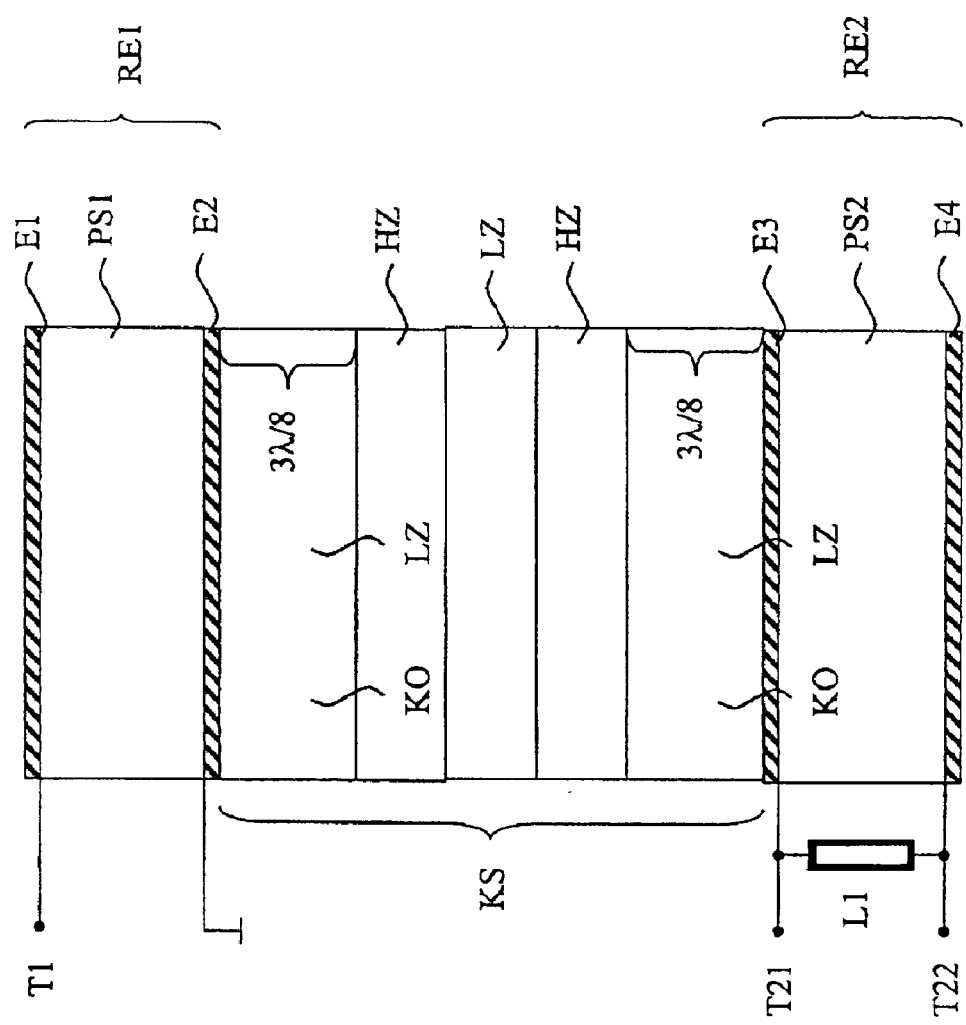
FIG. 6a is a further embodiment of a component according to the invention with an inductance connected in parallel with the second resonator.

FIG. 6a shows a further variant of the invention, where an inductance L1 is connected in parallel with the second resonator RE2.

Figure 6B:
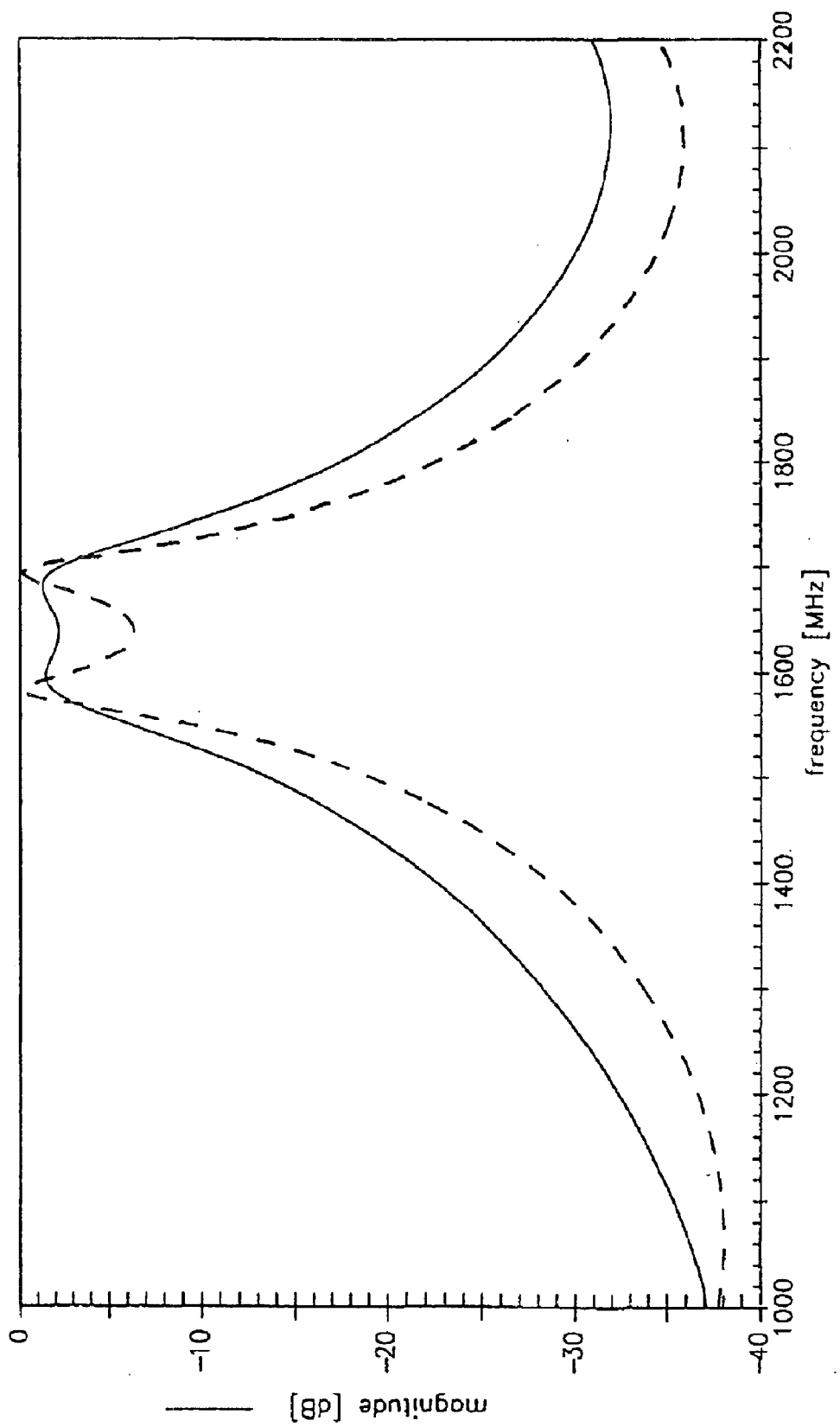
FIG. 6b is a graph showing the transfer function of an example of a component according to the invention, with (solid line) and without (dashed line) an inductance.

FIG. 6b shows a transfer function of an example of a component according to embodiments of the invention with and without an inductance. The transfer function of a component according to the embodiment of the invention without an inductance (dashed line) has a split passband with two resonances, whose frequencies differ, for example, by 50 to 200 MHz (in this case by 110 MHz), and a bandstop area located between them, with increased attenuation. The transfer function of a component according to the embodiment of the invention with an inductance is represented by a solid line. The value of the inductance L1 is preferably chosen such that the amplitude of the signal in the bandstop area between the resonances is increased by at least 50% compared to the variant without the inductance connected in parallel with the second resonator.

For the sake of clarity, the invention has been described just on the basis of a small number of embodiments, but is not restricted to these embodiments. Further variation options exist in particular with regard to the possible combination of the arrangements described above and to the number of layers in the said layer areas of the components according to the invention. The invention is not restricted to a specific frequency band or to a specific field of application. Any of the layers in the component according to the invention (for example the piezoelectric layer or the electrodes) may also have a multilayer structure.

What is claimed is:

1. A component operating with bulk acoustic waves, comprising:
    an asymmetric first port which has a signal-carrying connection;
    a symmetrical second port with a first and a second connection;
    a first resonator having a first electrode, a second electrode and a first piezoelectric layer that is arranged between the first and the second electrode, the first resonator being connected to the signal-carrying connection of the first port and being connected to a reference ground potential;
    an at least partially permeable coupling layer system having an alternating sequence of at least two $\lambda/4$ mirror layers with a different acoustic impedance and a compensation layer which has a thickness of $\lambda/8$;
    a second resonator that is stacked one on top of the first resonator and is acoustically coupled to the first resonator via the coupling layer system, the second resonator having a third electrode, a fourth electrode and a second piezoelectric layer which is arranged between the third and the fourth electrode, the second resonator being connected between the first and the second connection of the second port.

2. The component as claimed in claim 1, further comprising:
    an acoustic mirror that is arranged on that side of at least one of the first and the second resonator facing away from the coupling layer system, and comprises at least two alternating layers with thicknesses of $\lambda/4$ of different acoustic impedance.

3. The component as claimed in claim 1, wherein the compensation layer is arranged between the mirror layers of the coupling layer system.

4. The component as claimed in claim 1, wherein the compensation layer is arranged between the second electrode and an uppermost mirror layer of the coupling layer system, or between the third electrode and a lowermost mirror layer of the coupling layer system.

5. The component as claimed in claim 1, wherein one of the mirror layers of the coupling layer system is combined with the compensation layer in a layer whose thickness is $3\lambda/8$.

6. The component as claimed in claim 1, further comprising at least one further compensation layer.

7. The component as claimed in claim 6, further comprising:
    an acoustic mirror that is arranged on that side of at least one of the first and the second resonator facing away from the coupling layer system, and in which the at least one further compensation layer is a component of the acoustic mirror.

8. The component as claimed in claim 6, wherein the at least one further compensation layer is formed from silicon oxide.

9. The component as claimed in claim 1, wherein the compensation layer is formed from silicon oxide.

10. The component as claimed in claim 1, further comprising an inductance, wherein the component is configured to provide a transfer function that has a split passband with two resonances that differ from one another by 50 to 200 MHz, and a bandstop area located between them, in which the inductance is connected in parallel with the second resonator and is chosen such that an amplitude of a signal in the bandstop area between the resonances is increased by at least 50%.

11. The component as claimed in claim 1, further comprising further resonators that are stacked one on top of the other and are arranged above or below the first and the second resonator.

12. The component as claimed in claim 11, wherein at least some of the further resonators are in each case acoustically coupled to one another via a further at least partially permeable coupling layer system.

* * * * *